(12) United States Patent
Voraberger

(10) Patent No.: US 11,044,812 B2
(45) Date of Patent: *Jun. 22, 2021

(54) COMPONENT CARRIER WITH ADHESION PROMOTING SHAPE OF WIRING STRUCTURE

(71) Applicant: AT&S Austria Technologie & Systemtechnik Aktiengesellschaft, Leoben (AT)

(72) Inventor: Hannes Voraberger, Graz (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

This patent is subject to a terminal disclaimer.

(21) Appl. No.: 16/418,011

(22) Filed: May 21, 2019

(65) Prior Publication Data

US 2019/0274218 A1  Sep. 5, 2019

Related U.S. Application Data

(62) Division of application No. 15/808,926, filed on Nov. 10, 2017, now Pat. No. 10,349,521.

(30) Foreign Application Priority Data

Nov. 10, 2016 (EP) ................................. 16198274

(51) Int. Cl.
*H05K 7/00* (2006.01)
*H05K 1/18* (2006.01)
(Continued)

(52) U.S. Cl.
CPC ......... *H05K 1/181* (2013.01); *H01L 21/4846* (2013.01); *H01L 23/498* (2013.01);
(Continued)

(58) Field of Classification Search
CPC .............. H01L 21/4846; H05K 1/0242; H05K 1/0306; H05K 1/11; H05K 1/181;
(Continued)

(56) References Cited

U.S. PATENT DOCUMENTS 5,510,655 A * 4/1996 Tanielian .......... H01L 21/30608
257/621
5,609,773 A * 3/1997 Usui ................... H01L 21/4857
216/100
(Continued)

FOREIGN PATENT DOCUMENTS

JP 2002198639 A 7/2002
JP 2004193168 A 7/2004

OTHER PUBLICATIONS

Batev, P.; Communication Pursuant to Article 94(3) EPC in Application No. 16 198 274.9; pp. 1-6, Jan. 21, 2021; European Patent Office, 80298, Munich, Germany.

*Primary Examiner* — Yuriy Semenenko
(74) *Attorney, Agent, or Firm* — Robert A. Blaha; Smith Tempel Blaha LLC

(57) ABSTRACT

A component carrier includes a base structure and an electrically conductive wiring structure on the base structure. The wiring structure has a nonrectangular cross-sectional shape configured so that an adhesion promoting constriction is formed by at least one of the group consisting of the wiring structure and a transition between the base structure and the wiring structure.

13 Claims, 3 Drawing Sheets

(51) Int. Cl.
*H01L 21/48* (2006.01)
*H01L 23/498* (2006.01)
*H05K 1/02* (2006.01)
*H05K 1/11* (2006.01)
*H05K 3/38* (2006.01)
*H05K 1/03* (2006.01)

(52) U.S. Cl.
CPC ......... *H05K 1/0242* (2013.01); *H05K 1/0306* (2013.01); *H05K 1/11* (2013.01); *H05K 3/38* (2013.01); *H05K 3/382* (2013.01); *H05K 2201/098* (2013.01); *H05K 2201/10689* (2013.01)

(58) Field of Classification Search
CPC ... H05K 2201/098; H05K 2201/10689; H05K 3/38; H05K 3/382
USPC ........................................................ 361/777
See application file for complete search history.

(56) References Cited

U.S. PATENT DOCUMENTS

| | | | |
|---|---|---|---|
| 6,312,791 B1* | 11/2001 | Fasano | H05K 1/113 174/257 |
| 6,413,620 B1 | 7/2002 | Kimura et al. | |
| 7,678,695 B2* | 3/2010 | Taniguchi | H05K 1/115 438/667 |
| 7,804,031 B2* | 9/2010 | Nakai | H05K 1/0216 174/255 |
| 10,349,521 B2* | 7/2019 | Voraberger | H01L 21/4846 |
| 2001/0002728 A1* | 6/2001 | Tsukada | H05K 3/3452 257/693 |
| 2002/0046880 A1* | 4/2002 | Takubo | H01L 23/49827 174/261 |
| 2003/0137056 A1* | 7/2003 | Taniguchi | H05K 1/115 257/774 |
| 2004/0011555 A1* | 1/2004 | Chiu | H05K 3/4647 174/256 |
| 2006/0231288 A1 | 10/2006 | Vanfleteren et al. | |
| 2006/0251873 A1 | 11/2006 | Wu et al. | |
| 2008/0308307 A1 | 12/2008 | Chang et al. | |
| 2009/0107704 A1 | 4/2009 | Vanfleteren et al. | |
| 2009/0183901 A1 | 7/2009 | Kataoka et al. | |
| 2013/0308175 A1 | 11/2013 | Yasui et al. | |
| 2015/0228551 A1* | 8/2015 | Oi | H01L 24/13 257/737 |
| 2016/0150642 A1 | 5/2016 | Kajita et al. | |
| 2018/0035534 A1 | 2/2018 | Taniguchi et al. | |

\* cited by examiner

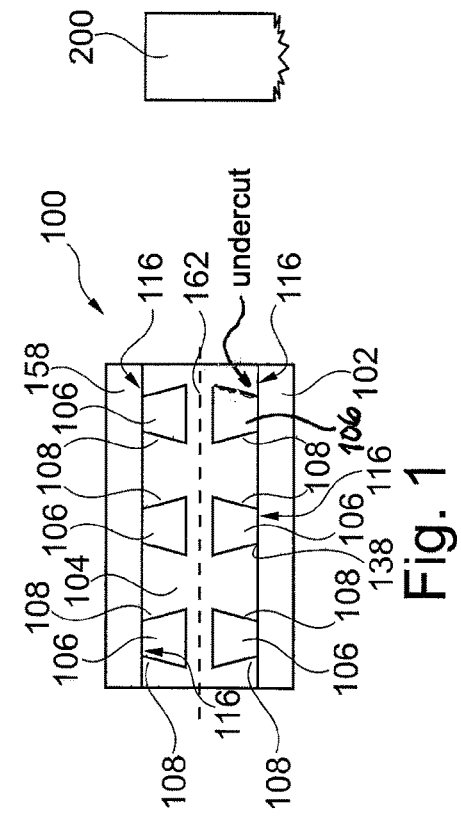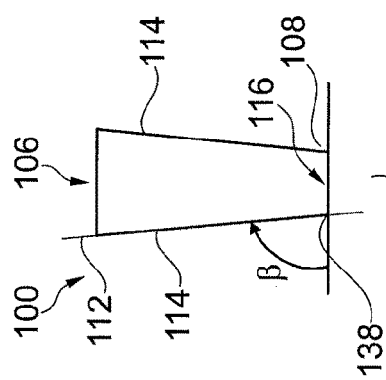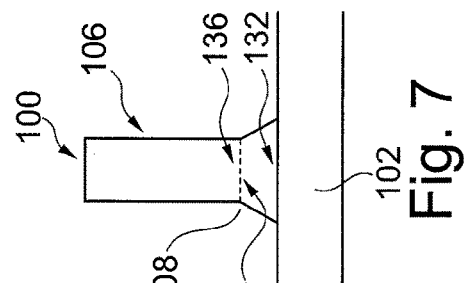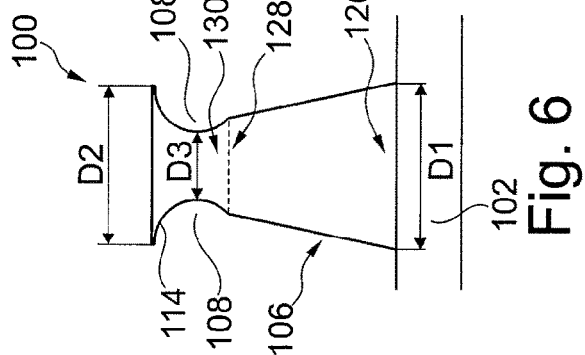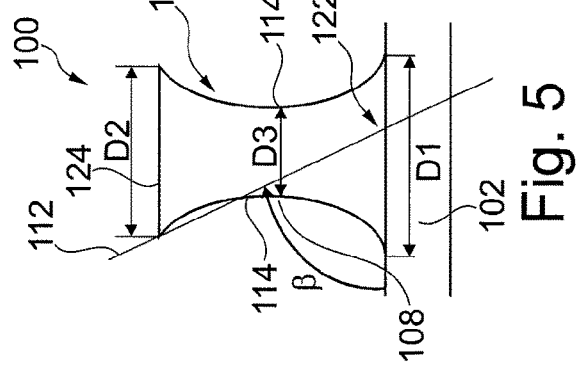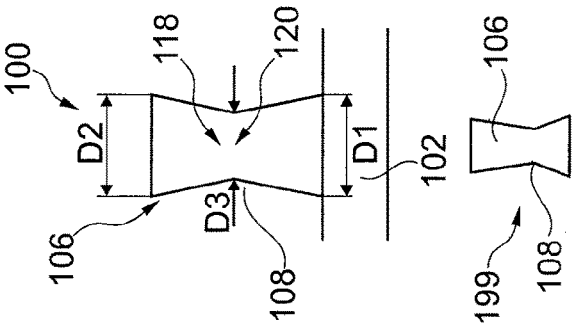

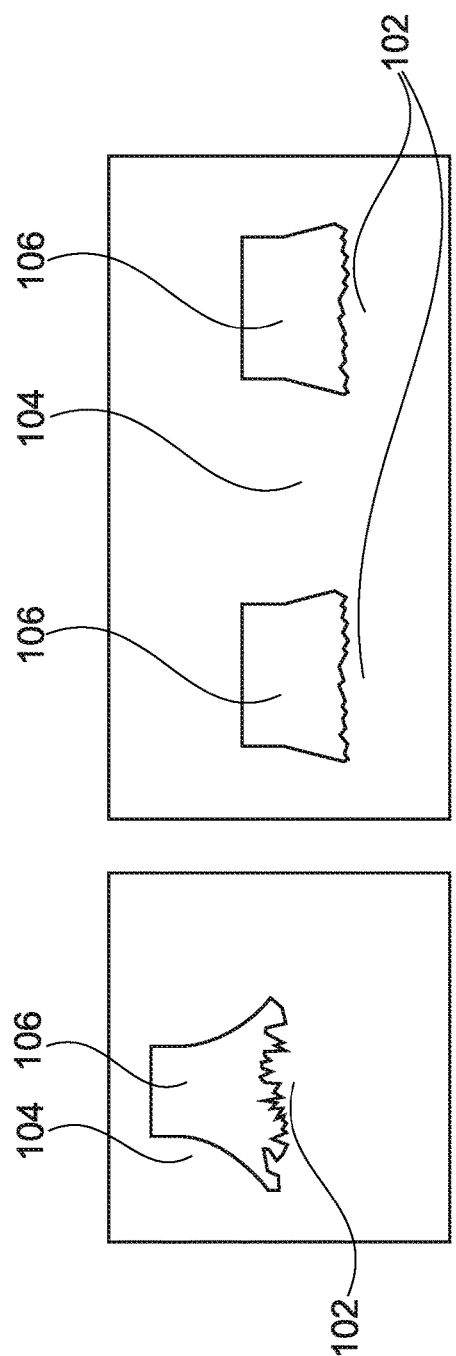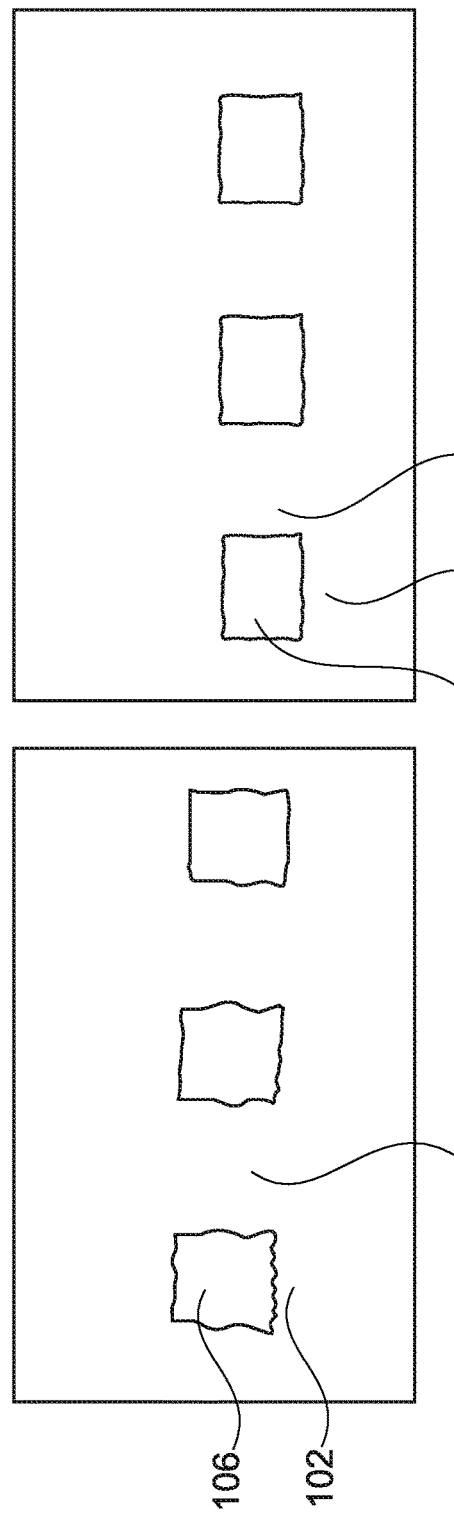

COMPONENT CARRIER WITH ADHESION PROMOTING SHAPE OF WIRING STRUCTURE

CROSS-REFERENCE TO RELATED APPLICATIONS

This application is a divisional application of U.S. patent application Ser. No. 15/808,926, filed on Nov. 10, 2017, which claimed the benefit of the filing date of European Patent Application No. 16 198 274.9, filed 10 Nov. 2016, the disclosures of which are hereby incorporated herein by reference.

TECHNICAL FIELD

The embodiments of the invention relate to a component carrier, to a method of manufacturing a component carrier, and to method of use.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, proper adhesion of elements of a component carrier is an issue. Delamination between adjacent layers of a layer stack of a component carrier may deteriorate reliability of the component carrier.

There may be a need to provide a component carrier with high reliability.

SUMMARY

In order to achieve the need defined above, a component carrier, a method of manufacturing a component carrier, and a method of use according to the independent claims are provided.

According to an exemplary embodiment of the invention, a component carrier is provided which comprises a base structure and an electrically conductive wiring structure on the base structure, wherein the wiring structure has a nonrectangular cross-sectional shape configured so that an adhesion promoting constriction is formed by the wiring structure and/or a transition between the base structure and the wiring structure.

According to another exemplary embodiment of the invention, a method of manufacturing a component carrier is provided, wherein the method comprises forming an electrically conductive wiring structure on a base structure, wherein the wiring structure is formed with a nonrectangular cross-sectional shape so that an adhesion promoting constriction is formed by the wiring structure and/or a transition between the base structure and the wiring structure.

According to still another exemplary embodiment of the invention, a wiring structure of a component carrier having the above-mentioned features is used for conducting a radio frequency (RF) signal, in particular a radio frequency signal with a frequency above 1 GHz.

Overview of Embodiments

In the context of the present application, the term "component carrier" may particularly denote any support structure which is capable of accommodating one or more electronic components thereon and/or therein for providing both mechanical support and electrical connectivity. In particular, a component carrier may be a printed circuit board or an IC (integrated circuit) substrate or interposer.

In the context of the present application, the term "nonrectangular cross-sectional shape" may particularly denote that in a plane perpendicular to a current flow direction of the wiring structure, the wiring structure has an appearance which differs from that of a rectangle or a square. While a portion of such nonrectangular wiring structure may have the shape of a rectangle, the term nonrectangular only excludes that not the entire cross section of the wiring structure has the shape of a rectangle.

In the context of the present application, the term "adhesion promoting constriction" may particularly denote a form feature or shape feature or geometrical feature of (in particular a side wall of) the wiring structure itself or at a connection position between (in particular a bottom of) the wiring structure and the base structure which promotes a form closure and/or a frictional engagement between material of the wiring structure and surrounding material of the component carrier, in particular material of an electrically insulating layer structure. In contrast to a mere microscopic roughening of an exterior surface with microstructures being significantly smaller than the dimensions of the wiring structure, an adhesion promoting constriction according to an exemplary embodiment may be a more macroscopic structure in the same order of magnitude as the dimensions of the wiring structure. Generally, such an adhesion promoting constriction may be any spatial or geometric discontinuity resulting in a deviation from a rectangular shape which has the capability of increasing the adhesion forces between material of the wiring structure and directly adjacent material of the component carrier, in particular by increasing the connection surface over a rectangular geometry.

In the context of the present application, the term "radio frequency signal" may particularly denote an electric or electromagnetic signal propagating along the wiring structure in a range of frequencies used for communications or radar signals. In particular, a radio frequency (RF) signal may for example have a frequency in the range between 3 kHz and 300 GHz.

According to an exemplary embodiment of the invention, a wiring structure of a component carrier is provided with a nonrectangular cross-sectional shape to improve the adhesion properties between material of the wiring structure and surrounding material of the component carrier as a result of the formation of one or more adhesion promoting constrictions intrinsically by the shape of the wiring structure itself and/or due to a constricted geometry at an interface between a base structure (on which the wiring structure is formed) and the wiring structure itself. Such a non-rectangular geometry (preferably with curved side surface) may increase the lateral surface area of the wiring structure being exposed to surrounding material of the component carrier. An increased contact surface may improve adhesion. By such one or more constrictions of a wiring structure of a component carrier, macroscopic delamination obstacles rather than a merely microscopic roughening can be established to thereby promote a mechanical interlocking or catching or clawing or wedging between the different materials of wiring structure and its direct surrounding. It has turned out that such a geometric configuration of the wiring structure and/or its transition to the base structure can be highly efficiently used to obtain an improvement in the overall adhesion within the component carrier. More specifically, this has the further significant technical advantage that a conventional roughening procedure of roughening the exterior surface of the wiring structure for promoting adhesion becomes dispensable. This on the one hand simplifies the manufacturing procedure, since the separate process of roughening can be omitted (if desired). On the other hand, the well-known skin effect (according to which an electric signal with a high-frequency, for instance in the gigahertz range, does not propagate over an entire cross-section of a conductor, but propagates substantially only within a skin-like surface portion thereof) may cause significant signal losses with roughened surfaces. Without wishing to be bound to a specific theory, it is presently believed that such signal losses may result from an additional electric resistance or impedance which the traveling radio-frequency signal suffers as a consequence of a micro roughening of a surface. Advantageously, such signal losses can be prevented or at least strongly suppressed when one or more macroscopic constrictions (with typical dimensions larger than the typical skin dimensions) are implemented for promoting adhesion within the component carrier. For example, a desired shape of the constriction(s) of the nonrectangular wiring structure can be well defined by an anisotropic etching procedure, if desired accompanied by the supply of appropriate additives to a chemical etchant, during formation of the wiring structure. Thus, phenomena such as underetching or the formation of undercuts by etching can be advantageously used according to exemplary embodiments of the invention.

More specifically, there is a strong demand in the field of component carriers (in particular in the field of printed circuit boards, PCB) to reduce line and space (i.e. to reduce the lateral dimension of wiring structures itself as well as the distance between adjacent wiring structures). Reduced line width and space can be achieved by reducing surface roughness (which appears to be conventionally necessary if the line space characteristic L/S reaches or falls below about 40 μm). Surface roughness shows an impact on adhesion between copper and dielectric material. However, formation of high surface roughness is cumbersome and involves limitation for the propagation of radio-frequency signals. According to an exemplary embodiment of the invention, a solution for reducing L/S and keeping good adhesion is provided. This can be achieved by exemplary embodiments of the invention by adjusting the shape of fine lines of the wiring structure in order to achieve proper mechanical adhesion and fixing between adjacent layer structures. In particular, the present inventor has identified that proper adhesion within a component carrier can be achieved without involving a cumbersome roughening procedure and without deteriorating the propagation characteristic of radio-frequency signals by providing a wiring structure with lines that are widening up at the bottom (to increase adhesion) and are straight in the upper part (increased adhesion by small impact on achieving fine lines). Furthermore, the desired properties may be achieved by configuring a wiring structure with lines that are broader on the top of the line compared to the bottom or narrower in the middle.

In the following, further exemplary embodiments of the component carrier and the methods will be explained.

In an embodiment, both opposing side walls of a wiring structure may comprise a respective constriction. More specifically, the two opposing side walls of a wiring structure may have the same shape and constriction. Alternatively, the two opposing side walls of the wiring structure may have different geometries, in particular may have different constrictions or one side may be free of a constriction. It is also possible that one side wall is or both side walls are equipped with multiple constrictions.

In an embodiment, the component carrier comprises an electrically insulating layer structure in contact with the electrically conductive wiring structure, in particular embedding at least part of the electrically conductive wiring structure. For instance, such an electrically insulating layer structure may be interconnected with the wiring structure by lamination, wherein the adhesion promoting constriction promotes mutual adhesion between the material of the electrically insulating layer structure (in particular prepreg) and metallic material of the wiring structure (in particular copper) embedded in the electrically insulating layer structure.

In an embodiment, the constriction may be located on a side wall of the wiring structure and may be embodied as a curved sidewall or sidewall portion. By such a (in particular concave and/or convex) curvature, the effective contact area between the wiring structure and surrounding component carrier material may be increased, thereby also increasing the adhesion strength.

In an embodiment, the adhesion promoting constriction is formed by a side wall of the wiring structure, in particular by a curved side wall or a kink on the side wall. Hence, any discontinuity on the side wall of the wiring structure may efficiently increase adhesion with material of the component carrier arranged there.

In an embodiment, the adhesion promoting constriction is formed by a kink at the transition between the base structure and the wiring structure. Such a kink should have a small (in particular acute) angle for providing a strong adhesion promoting effect. For instance, a trapezoidal wiring structure with its wide side on the base structure and its narrow side remote from the base structure will be incapable of providing an adhesion promoting effect, since a corresponding obtuse angle from the surface of the base structure up to the side surface of this kind of trapezoidal wiring structure will not provide any interlocking function with surrounding material.

In an embodiment, the wiring structure has a first horizontal extension at a contact position with the base structure, has a second horizontal extension at an end position opposing the contact position, and has a third horizontal extension at an intermediate position between the contact position and the end position, wherein the third horizontal extension is smaller than the first horizontal extension and is smaller than the second horizontal extension. Such a geometry, which is shown for instance in FIG. 4 and FIG. 5, has turned out to highly efficiently improve adhesion, since electrically insulating material of the component carrier may accumulate in pockets formed on one or both sides surfaces of the wiring structure. Moreover, the effective contact surface with adjacent material is thereby increased. Thus, in particular a shape may be advantageous in which there is a local narrowing in the center of a cross section of the wiring structure.

In an embodiment, a narrowing factor of the wiring structure with the constriction (i.e. a ratio between the most narrow (for instance third) horizontal extension and the widest (for instance first and/or second) horizontal extension) may be in a range between 40% and 95%, in particular in a range between 50% and 85%. In other words, narrowing can be defined as 40% to 95% of the feature size of the wiring structures on top and bottom side, in particular 50% to 85%. It has turned out that such a design results in a very pronounced improvement in terms of adhesion.

In an embodiment, the intermediate position corresponds to the constriction or to a narrowest section of the wiring structure. In particular, the intermediate position may be a middle position between the contact position and the end position. A corresponding very symmetric geometry has turned out to be particularly stable.

In an embodiment, the constriction comprises an undercut (such as a recess surface). Referring to a printed circuit board construction, the term undercut may refer to the portion of the wiring structure (in particular made of copper) that is etched away under the base structure. Such an undercut may form a deep pocket into which material of the electrically insulating layer structure may be pressed during lamination, thereby improving mutual adhesion with the wiring structure.

In an embodiment, the constriction is defined by an acute angle (i.e. an angle smaller than 90°) extending from a (in particular planar) surface of the base structure up to a tangent on a side wall of the wiring structure. Corresponding embodiments are shown in FIG. 3 or FIG. 5. The more the acute angle assumes a beak shaped geometry, i.e. in particular with small acute angles, the more pronounced can be the constriction and the stronger can be the connection with the electrically insulating material of the component carrier. In particular, the tangent on the side wall of the wiring structure may correspond to the position of the transition (see FIG. 3).

In an embodiment, the constriction is formed by a wiring structure with a trapezoidal cross-section with a narrow end on the base structure (see for instance FIG. 3). Contrary to a wiring structure with a trapezoidal cross-section with a widened end on the base structure, a trapezoidal cross-section with a narrow end on the base structure has the capability of significantly improving adhesion with surrounding material because of its significantly better interlocking effect with surrounding component carrier material.

In an embodiment, the constriction is formed by a wiring structure with a double trapezoidal cross-section with narrow ends of both trapezoids facing each another (compare for example FIG. 4). This allows to form an edge type constriction being specifically powerful for improving adhesion by forming a substantial mechanical obstacle for surrounding dielectric material from delaminating from the wiring structure.

In an embodiment, the constriction is formed by a wiring structure with a concave side wall (compare for example FIG. 5). Such a structure, which can be easily manufactured by anisotropic etching, also provides a significant obstacle for surrounding component carrier material from being released from the wiring structure material.

In an embodiment, the constriction is formed by a wiring structure with a trapezoidal cross-sectional portion with a wide end on the base structure. A narrow end of the trapezoidal cross-sectional portion may face a bottom end of another portion of the wiring structure with a concave side wall (see FIG. 6). Also such a geometry has turned out to be highly efficient for improving adhesion.

In an embodiment, the constriction is formed by a wiring structure with a trapezoidal cross-sectional portion with a wide end on the base structure and a narrow end facing a bottom end of a rectangular cross-sectional portion of the wiring structure (compare FIG. 7). Also this overall non-rectangular geometry has turned out to provide a certain degree of improvement in terms of adhesion.

In an embodiment, the wiring structure has a smooth surface. Thus, it can be dispensable to roughen the surface of the wiring structure, since already the provision of the adhesion promoting constriction(s) may provide a sufficient improvement of the adhesion.

In an embodiment, a surface of the wiring structure has a roughness Ra of less than 3 µm, in particular of less than 1.5 µm, more particularly of less than 0.5 µm. These roughness values are compatible with a low loss transmission of radiofrequency signals through the wiring structure, since no excessive surface roughness deteriorates signal propagation under consideration of the skin effect. Moreover, a cumbersome specific roughening procedure may be omitted when forming the wiring structure.

However, it should be emphasized that, in other exemplary embodiments, a wiring structure with an adhesion promoting constriction can be provided additionally with a roughened surface (in particular with a surface having a surface roughness Ra of at least 4 µm, in particular of at least 6 µm), for example in a scenario in which transmission of radiofrequency signals is not an issue and/or when a specifically high adhesion characteristic of the component carrier is required. In the latter case, the roughened surface and the constriction synergistically combine to an enormous net adhesion.

In an embodiment, the adhesion promoting constriction corresponds to a mechanical feature (in particular of the wiring structure itself) with a dimension of at least 10 µm, in particular at least 15 µm. Thus, typical dimensions of the adhesion promoting constriction of the wiring structure may be significantly larger than typical dimensions of protrusions or indentations of a conventionally roughened surface. These dimensions of at least 10 µm are so high that even a pronounced skin effect of propagating signals with very high frequency does not negatively influence signal propagation.

In an embodiment, the wiring structure has a line/space (L/S) value of less than 50 µm, in particular of less than 40 µm, more particularly of less than 30 µm. In terms of fine line structuring with the mentioned small dimensions, merely roughening an exterior surface of the wiring structure for improving adhesion comes to its limits and contravenes to the requirements of such tiny wiring structures. Providing a macroscopic constriction rather than roughening an exterior surface according to an exemplary embodiment of the invention allows to continue miniaturization to fine line structures without loss of adhesion.

In an embodiment, the base structure comprises at least one of an electrically conductive layer structure and a dielectric layer structure. Thus, the wiring structure may be arranged on a metallic base such as a copper base or on a dielectric base such as a prepreg base.

In an embodiment, the wiring structure is configured as conductor track or lead, in particular an elongated conductor track extending within a horizontal plane of the component carrier (for instance extending in parallel to a planar base structure). Preferably, an extension of the conductor track in a direction perpendicular to a cross-sectional plane in which the constriction is defined at a side wall of the wiring structure may be significantly larger than (in particular at least three times of, more particularly at least five times of, further more particularly at least ten times of) a diameter of the conductor track in the mentioned cross-sectional plane.

In an embodiment, the component carrier further comprises an electronic component mounted on and/or embedded in the component carrier material, in particular in the base structure and/or in the electrically insulating layer structure. For instance, the electronic component may be a radio-frequency semiconductor chip configured for emitting and/or receiving radiofrequency signals via the wiring structure. Hence, the electronic component may be configured for executing a radio frequency application, in particular a radio frequency application involving frequencies above 2 GHz.

More generally, the at least one electronic component can be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be embedded in the component carrier. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. However, the electronic component may also be a further component carrier, for example in a board-in-board configuration.

In an embodiment, the constriction is formed by an anisotropic etching procedure. By adjusting the etching parameters, etchant (in particular additives), etc., the shape of the etched wiring structures can be precisely adjusted.

In an embodiment, the constriction is formed by a subtractive process. Subtractive methods may remove copper from an entirely copper-coated board to leave only a desired copper pattern. Thus, the procedure of forming the wiring structure may start from a larger metallic structure (such as a copper foil) and may then form the wiring structure with the constriction by material removal.

In an embodiment, the constriction is formed by a modified semi-additive process. Such a mSAP (modified semi-additive process) for fine line PCB structuring may form the wiring structure by a combination of addition of material and removing material. For instance, channels may be defined on a copper foil, and additional copper material may be applied thereon, before an etching procedure defines the final wiring structure. More specifically, in a semi-additive process, a non-patterned board may have a thin layer of copper already on it. A mask may then be applied which exposes those parts of the board that will become the traces. Additional copper may then be plated onto the board in the unmasked areas. The mask may be stripped away and a brief etching process may remove the now-exposed bare original copper laminate from the board, isolating the individual traces or wiring structures.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design of the electronic device, wherein the component carrier nevertheless provides a large basis for mounting electronic components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and an IC substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "IC substrate" may particularly denote a small component carrier having substantially the same size as an electronic component to be mounted thereon.

In an embodiment, the at least one electrically insulating layer structure comprises at least one of the group consisting of resin (such as reinforced or non-reinforced resins, for instance epoxy resin or Bismaleimide-Triazine resin or cyanate ester), glass (in particular glass fibers, multi-layer glass or glass-like materials), prepreg material, polyimide, polyamide, liquid crystal polymer, epoxy-based Build-Up Film, FR4 material, polytetrafluoroethylene (Teflon), a ceramic, and a metal oxide. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, the component carrier is a laminate-type component carrier. In such an embodiment, the component carrier is a compound of multiple layer structures which are stacked and connected together by applying a pressing force, if desired accompanied by heat.

BRIEF DESCRIPTION OF THE DRAWINGS

The aspects defined above and further aspects of the invention are apparent from the examples of embodiment to be described hereinafter and are explained with reference to these examples of embodiment.

FIG. 1 illustrates a component carrier according to an exemplary embodiment of the invention.

FIG. 2 illustrates a method of roughening a surface of a wiring structure of a component carrier.

FIG. 3, FIG. 4, FIG. 5, FIG. 6 and FIG. 7 illustrate cross-sectional shapes of wiring structures of component carriers according to exemplary embodiments of the invention.

FIG. 8, FIG. 9, FIG. 10 and FIG. 11 are images of manufactured wiring structures of component carriers according to exemplary embodiments of the invention.

The illustrations in the drawings are schematic. In different drawings, similar or identical elements are provided with the same reference signs.

DETAILED DESCRIPTION OF EXEMPLARY EMBODIMENTS

Figure 12:
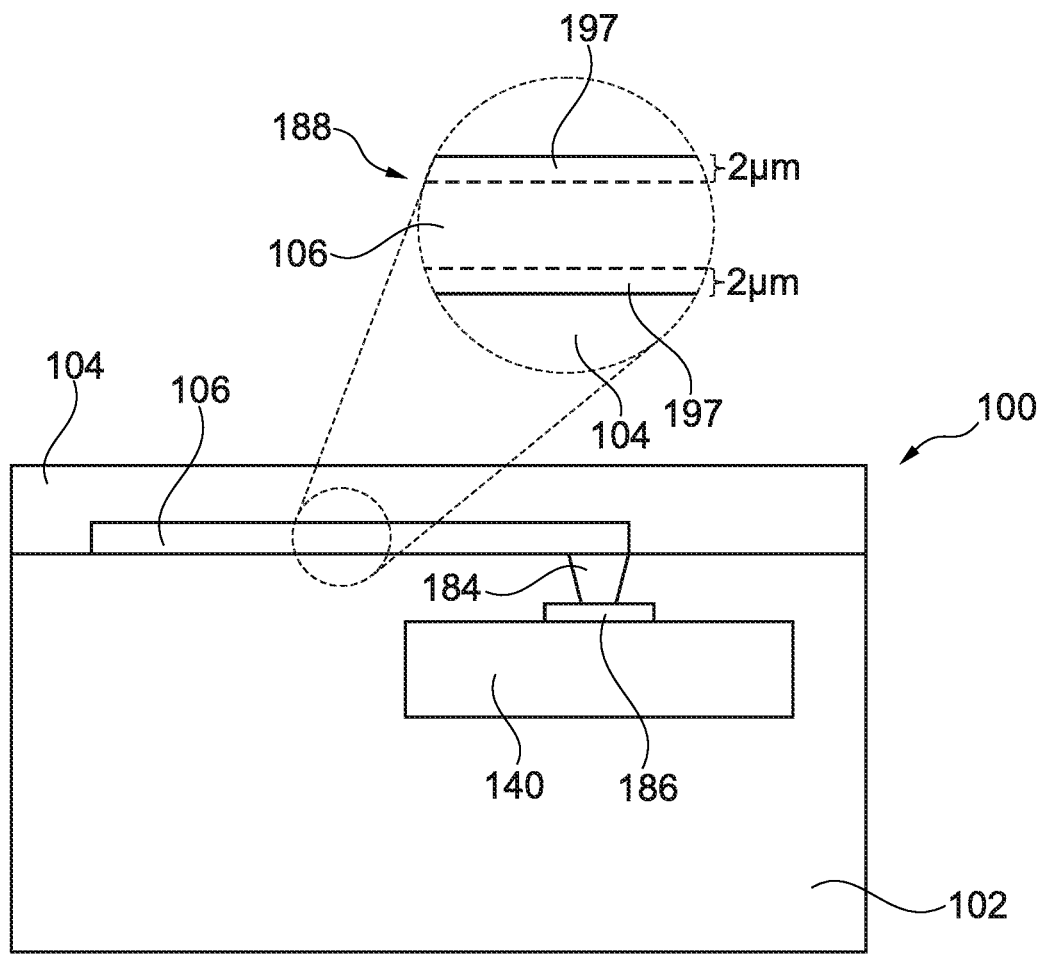
FIG. 12 illustrates a component carrier configured for carrying out a radio frequency application according to an exemplary embodiment of the invention.

Before, referring to the drawings, exemplary embodiments will be described in further detail, some basic considerations will be summarized based on which exemplary embodiments of the invention have been developed.

An exemplary embodiment of the invention provides a technology capable of improving adhesion of fine line wiring structures of a component carrier such as a PCB.

Adhesion between neighbored layer structures in a component carrier such as a PCB can be realized by mechanical adhesion. This mechanical adhesion can be conventionally improved by increasing the roughness of the surface of adjacent layer structures that should show good adhesion. Consequently, for achieving proper adhesion between neighbored surfaces in a component carrier, surface roughness between the layer structures may be increased.

However, when it comes to fine line structuring (i.e. wiring structures with very small dimensions), this roughness is limiting the performance of structuring processes. As a result for being able to achieve component carrier structures below about 40 μm line width, adhesion improving surface roughness should be reduced drastically. This shows severe consequences when it comes to adhesion between adjacent layer structures and reliability, respectively.

In addition to this, another problem occurs if signals with higher frequency are conducted via these roughened lines. The conduction of a signal with higher frequency is solely taking place in the outer part of the conducting trace due to the skin effect. As an example, a 1 GHz signal is guided in the outermost about 2 μm of the conducting trace or wiring structure. If the roughness in the surface is high and in the same order of magnitude, it may come to disturbing effects of the electrical signal by reflections and other kinds of signal losses.

In order to overcome these and other shortcomings, an exemplary embodiment of the invention provides a solution to increase adhesion between adjacent layer structures of a component carrier by generating special structural features (such as adhesion promoting constrictions) that are improving adhesion between the wiring structure and its direct surrounding in the component carrier without the need to increase the roughness and consequently having no impact on structuring density. For radio frequency lines, the surface roughness can even be reduced by exemplary embodiments of the invention, if desired.

A gist of an exemplary embodiment of the invention is based on adjusting or trimming the shape of fine lines and features in a component carrier such as a PCB in order to achieve high mechanical adhesion and fixing strength between adjacent layers. It turned out that lines that show in their cross section to be broader on the top of the line compared to the bottom or narrower at in the middle resulted in a significantly improved adhesion behavior between the layer structures. A corresponding prerequisite in an exemplary embodiment of the invention may be that the area underneath the extended rim is properly filled with polymer material and/or polymer material like epoxide material. In this way, the shape of the electrically conductive line and the formed counter shape of electrically isolating material appears to behave similar as two chains of a zipper when they are closed. An advantage of such an embodiment is that due to the increase of the adhesion between PCB layers by this specific line shape, there is the possibility to reduce surface roughness (if desired) while keeping the same adhesion between the wiring structure and its surrounding within the component carrier. Taking this measure may have a positive impact on fine line structuring, especially when it comes to feature sizes of 40 μm and below. In addition, there may be a positive impact on alternating current (AC) signal integrity, in particular when it comes to signals with a frequency higher than 1 GHz.

Advantageously, exemplary embodiments of the invention may be implemented in any desired component carrier such as high-density integration (HDI) applications and substrates like FC-CSP substrates, FC-BGA substrates, etc. Highly advantageously, an exemplary embodiment of the invention offers a solution that enables to proceed miniaturization of mobile applications, wearable applications and any kinds of substrates. In addition to this, an exemplary embodiment of the invention offers a solution to improve signal integrity for those applications that are tending to a higher frequency range.

FIG. 1 illustrates a cross-sectional view of a component carrier 100, which is here embodied as a printed circuit board (PCB), according to an exemplary embodiment of the invention.

The illustrated component carrier 100 comprises a base structure 102 which can here be embodied as a layer of electrically insulating prepreg material, i.e. resin with reinforcing fibers therein. An electrically conductive wiring structure 106, which can be made of copper, is formed on the base structure 102 for example by means of a subtractive process or a (modified) semi-additive process. An electrically insulating layer structure 104, which may be made out of prepreg as well, is laterally and on an upper side in contact with the wiring structure 106. The base structure 102, the wiring structure 106, the electrically insulating layer structure 104 as well as a cover structure 158 (which can be a further prepreg layer) may be interconnected by lamination, i.e. the application of heat and/or mechanical pressure to thereby form a laminated stack. As can be taken from FIG. 1, the wiring structure 106, which forms a conductive track extending horizontally and perpendicular to the paper plane of FIG. 1, has a nonrectangular cross-sectional shape. In the shown embodiment, a number of parallel wiring structures 106 are formed directly on the base structure 102 as upside down oriented trapezoidal structures. As a result of this geometry, an adhesion promoting constriction 108 is formed at each respective transition between the base structure 102 and a respective one of the wiring structures 106. More precisely, at the position where the wiring structures 106 are positioned directly on the base structure 102, beak-shaped acute-angle undercut sections are formed between the base structure 102 and the wiring structure 106 promoting adhesion of material of the wiring structures 106 with material of the electrically insulating layer structure 104. In other words, the adhesion promoting constrictions 108 are formed by respective kinks with an acute angle at a respective transition 138 between the base structure 102 and the wiring structure 106. Thereby, undesired delamination at the border between these two different materials can be efficiently prevented.

In a corresponding way, adhesion promoting constrictions 108 are formed between the cover structure 158 and the upper row of parallel wiring structures 106 according to FIG. 1, which are placed upside down compared to the lower row of parallel wiring structures 106 according to FIG. 1. In particular, the component carrier 100 shown in FIG. 1 is a mirror symmetric structure being arranged in a symmetric way with regard to a mirror plane 162.

Hence, the constrictions 108 are formed according to FIG. 1 by wiring structures 106 with trapezoidal cross-sections having a respective narrow end 116 on the base structure 102 or on the cover structure 158. Thanks to the adhesion promoting effect of the constrictions 108, it is possible that the wiring structure 106 is configured with a smooth surface having for instance a roughness Ra of 0.3 μm. Omission of a roughening procedure, which is conventionally performed for promoting adhesion between a wiring structure and surrounding dielectric material, reduces the manufacturing effort, decreases the manufacturing time and allows to continue the ongoing trend of miniaturization in the component carrier technology towards smaller and smaller line/space values of for example 40 μm, which becomes less and less compatible with roughened copper surfaces. Moreover, undesired losses of radio-frequency signals with high-frequency values of 1 GHz or more, in which the skin effect involves undesired damping effects on a roughened surface, can be prevented by the more macroscopic constrictions 108.

FIG. 2 illustrates a method of roughening a surface of a wiring structure of a component carrier. FIG. 2 shows a preform 200 of a wiring structure with relatively smooth surface. As indicated by an arrow 202, a conventional manufacturing procedure roughens a surface of the preform 200 for forming a wiring structure 204. The roughened wiring structure 204 may have a rough surface, for instance having a roughness Ra of 4 μm. As described above, such a procedure can be omitted by exemplary embodiments of the invention which can be manufactured with smooth wiring structures 106.

However, when the above-described effort for roughening, damping of radio-frequency signals, and limitations involved by very low line/space values are not an issue and a component carrier 100 with a specifically high adhesion is required, an exemplary embodiment of the invention may provide both a roughened surface of the wiring structure 106 according to FIG. 2 as well as the provision of macroscopic constrictions 108 according to FIG. 1 or FIG. 3 to FIG. 12.

FIG. 3 to FIG. 7 illustrate cross-sectional shapes of wiring structures 104 of component carriers 100 according to exemplary embodiments of the invention.

Referring to FIG. 3, an embodiment similar to that of FIG. 1 is illustrated. According to FIG. 3, the constriction 108 is defined by an acute angle β<90° extending from a surface of the base structure 102 up to a tangent 112 on a side wall 114 of the wiring structure 106 (see arrow direction according to FIG. 3). As can be taken from FIG. 3, the tangent 112 on the side wall 114 of the wiring structure 106 intersects with the position of the transition 138.

Referring to FIG. 4, an embodiment with a local vertical constriction 108 defined by a double slanted side wall 114 is shown. The cross-sectional geometry of the wiring structure 106 according to FIG. 4 can be denoted as a sandglass shape.

According to FIG. 4, the adhesion promoting constriction 108 is formed by respective kinks on opposing side walls 114 of the wiring structure 106. More specifically, the wiring structure 106 of FIG. 4 has a first horizontal extension, D1, at a lower end or contact position with the base structure 102, has a second horizontal extension, D2, at an upper end or an end position opposing the contact position, and has a third horizontal extension, D3, at an intermediate position (in the shown embodiment exactly in the middle) between the contact position and the end position. According to FIG. 4, the third horizontal extension, D3, is smaller (for instance is only approximately 80%) of the first horizontal extension, D1, and of the second horizontal extension, D2 (having here identical dimensions). Thus, the relation D1=D2>D3 holds for the shown embodiment. The intermediate position corresponds to the constriction 108 and to a narrowest section of the wiring structure 106. In the embodiment of FIG. 4, the constriction 108 is formed by the shown wiring structure 106 with double trapezoidal cross-section, wherein narrow ends 118, 120 of both trapezoids face each another.

An alternative or additional embodiment 199 shown in FIG. 4 as well illustrates that, in the geometry according to FIG. 4, it is not necessary that the vertical position of the constriction 108 is in the middle between the contact position and the end position, but that is can be also vertically displaced with regard to the middle or central position (for instance downwardly according to embodiment 199).

Referring to FIG. 5, the shown wiring structure 106 has, in the illustrated cross-sectional view, two opposing concave side walls 114 with enormous adhesion promoting surface areas constituting adhesion promoting constrictions 108.

Also, in the embodiment of FIG. 5, a geometric construction can be made meeting the criterion that the constriction 108 is defined by an acute angle β extending from a surface of the base structure 102 up to a tangent 112 on a side wall 114 of the wiring structure 106. Reference is made to the corresponding description of FIG. 3.

Referring to FIG. 6, a more complex construction of a wiring structure 106 is shown which can however be manufactured by anisotropic etching (in particular chemical etching or laser etching/drilling). A skilled person will understand that an appropriate adaptation of etching parameters and/or etching materials (in particular the use of additives which may have an impact on a sidewall geometry) may be implemented for designing the geometry of the wiring structure 106.

In the embodiment according to FIG. 6, the shown constrictions 108 are formed by a wiring structure 106 with a trapezoidal cross-sectional portion with a wide end 126 on the base structure 102 and a narrow end 128 facing a bottom end 130 of another portion of the wiring structure 106 with a concave side wall 114.

Referring to FIG. 7, the constrictions 108 of the here illustrated embodiment are formed by a wiring structure 106 with a trapezoidal cross-sectional portion with a wide end 132 on the base structure 102 and a narrow end 134 facing a bottom end 136 of a rectangular cross-sectional portion of the wiring structure 106.

Although various embodiments have been shown in FIG. 1, FIG. 3 to FIG. 7, a skilled person will understand that many different sidewall geometries or base structure-wiring structure transition geometries may be implemented to precisely adjust the properties of constrictions 108 for promoting adhesion in accordance to any desired application.

FIG. 8 to FIG. 11 are images of wiring structures 104 of component carriers 100 according to exemplary embodiments of the invention.

Referring to FIG. 8, an image of an adhesion improved fine line structure according to an exemplary embodiment of the invention is shown which has been manufactured by subtractive etching. It can be seen that a wiring structure 106 on a base structure 102 with concave side walls and improved adhesion properties has been manufactured.

Referring to FIG. 9, an image of a wiring structure 106 according to another exemplary embodiment of the invention is shown which has an appearance similar to FIG. 7. Also, this wiring structure 106 has been formed by subtractive etching.

Referring to FIG. 10, an image of a wiring structure 106 according to yet another exemplary embodiment of the invention is shown which has similarities to the geometries according to FIG. 4 and FIG. 6. This structure has been manufactured by a modified semi-additive process. A big foot effect can be clearly seen in FIG. 10.

Referring to FIG. 11, a structure in accordance with a normal foot effect is shown for comparison purposes with FIG. 10.

FIG. 12 illustrates a component carrier 100 configured for carrying out a radio frequency application according to an exemplary embodiment of the invention.

In the component carrier 100 shown in a cross-sectional view in FIG. 12, an electronic component 140 is embedded in the base structure 102 and is connected to copper wiring structure 106 on prepreg base structure 102 via a pad 186 and a copper filled via as vertical through connection 184. The wiring structure 106 is embedded in dielectric material of electrically insulating layer structure 104. A detail 188 shows a portion of the wiring structure 106 from above, wherein the wiring structure 106 may be configured for example with a geometry similar to any of FIG. 1 or FIG. 3 to FIG. 7 and with smooth (i.e. not specifically roughened) walls. In the shown embodiment, the electronic component 140 may be a semiconductor chip configured for executing a radio frequency application by transmitting electronic signals via the wiring structure 106 having frequencies of for example 1 GHz.

Due to the skin effect, electronic signals with very high frequencies will propagate substantially only within a thin skin surface 197 of the wiring structure 106. Thickness of the skin surface 197 depends, inter alia, on the frequency but may be in the order of magnitude of 2 μm. A roughened surface, which is conventionally used for promoting adhesion of a wiring structure to surrounding dielectric material involves microstructures in the same order of magnitude of few micrometers and can therefore disturb the propagation of radiofrequency signals. In contrast to this, a wiring structure 106 of the component carrier 100 according to an exemplary embodiment of the invention accomplishes improvement of surface adhesion by the above-described adhesion promoting constriction 108 and can therefore render a roughening procedure dispensable. This reduces losses of the electronic radiofrequency signal.

It should be noted that the term "comprising" does not exclude other elements or steps and the "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a base structure; and
   an electrically conductive wiring structure on the base structure;
   wherein the wiring structure has a nonrectangular cross-sectional shape configured so that an adhesion promoting constriction is formed by at least one of the group consisting of the wiring structure and a transition between the base structure and the wiring structure,
   wherein the adhesion promoting constriction is formed by a double trapezoidal cross-section of the wiring structure with narrow ends of both trapezoids facing each another, wherein the side walls of the wiring structure are not curved;
   wherein the wiring structure has a first horizontal extension at a contact position with the base structure, has a second horizontal extension at an end position opposing the contact position, and has a third horizontal extension at an intermediate position between the contact position and the end position, wherein the third horizontal extension is smaller than the first horizontal extension and is smaller than the second horizontal extension, and
   wherein the component carrier comprises at least one of the group consisting of resin, Epoxy resin, Bismaleimide-Triazine resin, cyanate ester, prepreg material, polyimide, polyamide, polytetrafluoroethylene, liquid crystal polymer, epoxy-based Build-Up Film, FR4 material, FR5 material.

2. The component carrier according to claim 1, comprising an electrically insulating layer structure in contact with the electrically conductive wiring structure.

3. The component carrier according to claim 1, wherein the adhesion promoting constriction is formed by a side wall of the wiring structure.

4. The component carrier according to claim 1, wherein the adhesion promoting constriction is formed by a kink at the transition between the base structure and the wiring structure.

5. The component carrier according to claim 1, wherein the intermediate position corresponds to the constriction or to a narrowest section of the wiring structure.

6. The component carrier according to claim 1, wherein the constriction comprises an undercut.

7. The component carrier according to claim 1, wherein the constriction is defined by an acute angle extending from a surface of the base structure up to a tangent on a side wall of the wiring structure, wherein the tangent on the side wall of the wiring structure corresponds to the position of the transition.

8. The component carrier according to claim 1, comprising at least one of the following features:
   wherein the wiring structure has a smooth surface;
   wherein the wiring structure has a surface roughness of less than 3 μm;
   wherein the adhesion promoting constriction is a mechanical feature with a dimension of at least 10 μm;
   wherein the adhesion promoting constriction is designed with a ratio between a most narrow horizontal extension of the wiring structure and a widest horizontal extension of the wiring structure in a range between 40% and 95%;

wherein the wiring structure is arranged with a line/space value of less than 50 μm;

wherein the base structure comprises at least one of an electrically conductive layer structure and a dielectric layer structure.

9. The component carrier according to claim 2, further comprising:

an electronic component mounted on at least one of the base structure and the electrically insulating layer structure; or an electronic component embedded in at least one of the base structure and the electrically insulating structure.

10. The component carrier according to claim 9, comprising at least one of the following features:

wherein the electronic component is configured for executing a radio frequency application involving frequencies above 1 GHz;

wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

11. The component carrier according to claim 2, comprising at least one of the following features:

wherein at least one of the electrically conductive wiring structure and the base structure comprises at least one of the group consisting of copper, aluminum, and nickel;

wherein the component carrier is shaped as a plate;

wherein the component carrier is configured as one of the group consisting of a printed circuit board and an IC substrate;

wherein the component carrier is configured as a laminate-type component carrier.

12. A component carrier, comprising:

a base structure; and an electrically conductive wiring structure on the base structure;

wherein the wiring structure has a nonrectangular cross-sectional shape configured so that an adhesion promoting constriction is formed by at least one of a group consisting of the wiring structure and a transition between the base structure and the wiring structure; and wherein the adhesion promoting constriction is formed by a trapezoidal cross-sectional portion of the wiring structure with a wide end on the base structure and a narrow end facing a bottom end of another portion of the wiring structure with a concave side wall.

13. A component carrier, comprising:

a base structure; and an electrically conductive wiring structure on the base structure;

wherein the wiring structure has a nonrectangular cross-sectional shape configured so that an adhesion promoting constriction is formed by at least one of a group consisting of the wiring structure and a transition between the base structure and the wiring structure; and wherein the adhesion promoting constriction is formed by a trapezoidal cross-sectional portion of the wiring structure with a wide end on the base structure and a narrow end facing a bottom end of a rectangular cross-sectional portion of the wiring structure, wherein the width of the narrow end of the trapezoidal cross-sectional portion of the wiring structure has the same width as the bottom end of the rectangular cross-sectional portion of the wiring structure.

* * * * *